United States Patent [19]

Irmler

[11] 4,171,997
[45] Oct. 23, 1979

[54] METHOD OF PRODUCING POLYCRYSTALLINE SILICON COMPONENTS, PARTICULARLY SOLAR ELEMENTS

[75] Inventor: Horst Irmler, Mannheim, Fed. Rep. of Germany

[73] Assignee: Brown, Boveri & Cie, AG., Mannheim, Fed. Rep. of Germany

[21] Appl. No.: 902,083

[22] Filed: May 2, 1978

[30] Foreign Application Priority Data

May 6, 1977 [DE] Fed. Rep. of Germany ....... 2720327

[51] Int. Cl.² .................. B01J 17/00; H01L 29/04
[52] U.S. Cl. ......................... 148/187; 29/572; 136/89 TF; 148/1.5; 357/30; 357/59
[58] Field of Search ................. 148/1.5, 174, 187; 357/91, 59, 30; 29/572; 136/89 TF

[56] References Cited

U.S. PATENT DOCUMENTS

| | | | |
|---|---|---|---|
| 3,649,383 | 3/1972 | Akasaku | 148/171 |
| 3,900,943 | 8/1975 | Sirtl et al. | 29/572 |
| 3,953,876 | 4/1976 | Sirtl et al. | 357/60 |
| 4,019,195 | 4/1977 | Merino | 357/13 |
| 4,062,038 | 12/1977 | Cuomo et al. | 357/30 |

FOREIGN PATENT DOCUMENTS 1564935 6/1976 Fed. Rep. of Germany .
2609051 9/1976 Fed. Rep. of Germany .

OTHER PUBLICATIONS

Brodsky, "... Solar Cells with Polycrystalline Si ... ", IBM-TDB, 18, 1975, 582.
AEG-Prospekt "TSG Terrestrische Solar-Generatoren" Jan., 1977.

*Primary Examiner*—L. Dewayne Rutledge
*Assistant Examiner*—Upendra Roy
*Attorney, Agent, or Firm*—Oblon, Fisher, Spivak, McClelland & Maier

[57] ABSTRACT

A method of producing semiconductor components, particularly solar elements, in which a P- or N-semiconductor chip is subjected to an oxidation step prior to formation of the device PN junction, such that the external surface and internal grain boundaries of the wafer are covered by a passivating oxide layer. Thereafter, the oxide layer on at least a portion of the semiconductor chip is removed, and at least one PN junction is formed in the chip.

2 Claims, 7 Drawing Figures

METHOD OF PRODUCING POLYCRYSTALLINE SILICON COMPONENTS, PARTICULARLY SOLAR ELEMENTS

BACKGROUND OF THE INVENTION

1. Field of the Invention

This invention relates to a method of producing semiconductor components, and more particularly to a method of producing solar energy absorbing elements fabricated from polycrystalline semiconductor material in which at least two layers of different conductivity types and a corresponding PN junction are formed in a P-or N-conducting semiconductor chip.

2. Description of the Prior Art

The use of both monocrystalline and polycrystalline silicon in the production of solar elements is known. Such elements have been incorporated into solar cells and solar batteries to transform solar energy into electrical energy (DT-OS No. 26 09 051; DT-PS No. 15 64 935; AEG Prospectus "TSG Terrestrial Solar Generators", January 1977). In fact, efficiencies of 15% have been achieved using monocrystalline silicon, as well as efficiencies of 10% using polycrystalline silicon. However, wider use of monocrystalline silicon has been precluded because of the high cost of this material.

In preparing a crystalline material for use as a solar element, a PN-junction must be produced at the surface of the crystal and can be formed by known doping methods like epitaxy, ion implantation or the simpler diffusion techniques.

With diffusion of impurities like boron, phosphorus, lithium or aluminum into silicon, experience has shown that projections of the diffusion front occur at grain locations. These projections decrease the efficiency and, in extreme cases, can lead to an inner short circuit of the PN-junction to the opposite side.

SUMMARY OF THE INVENTION

Accordingly, it is one object of this invention to provide a novel method for producing semiconductor components using polycrystalline semiconductor material, preferably silicon, which are free of internal short circuits.

It is another object of this invention to provide a novel method for producing semiconductor solar elements exhibiting improved energy conversion efficiency.

These and other objects are achieved according to the invention by oxidizing the entire surface of a P- or N-conducting semiconductor chip, removing, at least partially, the oxide film on the semiconductor surface while retaining the oxide film on the grain boundaries, and thereafter proceding with the N- or P-doping.

The oxidizing step is performed in an oxygen atmosphere at a temperature range from 900° C. to 1150° C. for approximately 0.5–2 hours. Advantageously when diffusion, the preferred doping process, is employed, the diffusing of donors or acceptors in the semiconductor chip is enabled with no or only minimal diffusion at the $SiO_2$-protected grain boundaries of the polycrystalline semiconductor material.

As is customary in semiconductor technology, where oxidation steps are commonly employed, but generally for producing a mask or a partial covering (DT-OS 26 09 051) after diffusion, the oxidation process of the invention coats the semiconductor surface with a $SiO_2$ layer which acts as passivation for many doping substances. At grain boundaries the oxygen now preferentially diffuses into the chip interior and forms an oxide layer on the "internal surface". After oxidation, the silicon wafer is immersed in hydrofluoric acid to remove the oxide layer from the outer surfaces while the oxide on the grain boundaries is retained, since hydrofluoric acid does not penetrate into the atomic domain. This can be controlled via the time of treatment. If now the doping is carried out with the help of a diffusion process, the grain boundaries are passivated by the oxide layer and the difficulty mentioned above does not arise. The yield in fabrication and the efficiency of solar cells are significantly increased by these measures.

Parts of the oxide layer can be left intact in order to realize certain semiconductor structures or e.g. to prevent doping of the edge. The PN-junction is then likewise protected by the oxide layer.

The method of the invention is also applicable to the fabrication of other semiconductor components, in particular PSN-diodes, where, starting with P- or weakly N-conducting silicon, a high N-doping is produced on one side and a high P-doping on the other side of the semiconductor wafer. This technology is less costly than the standard production of selenium rectifiers. Furthermore, diodes and thyristors also can be made in which there are no high blocking voltage demands on any side, as are required mostly in power electronics wherein the operating voltage range is generally around or below 100 v.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
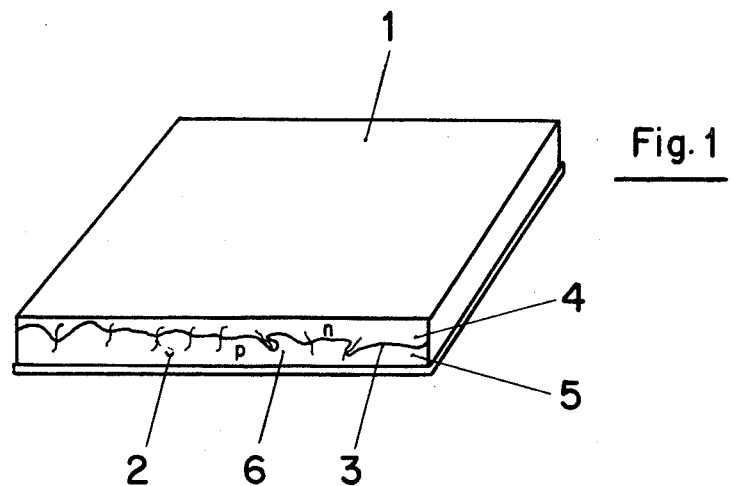
FIG. 1 is a view of a polycrystalline silicon wafer after customary diffusion.

Referring now to the drawings, wherein like reference numerals designate identical or corresponding parts throughout the several views, and more particularly to FIG. 1 thereof, there is seen a semiconductor wafer 1, e.g. about $10 \times 10$ cm in its larger dimensions and some tenths of a millimeter thick. Where the wafer 1 is cut, the grain boundaries are indicated by fine lines 2. The irregular diffusion front, the PN-junction, as it is formed by the usual diffusion of phosphorus into P-conducting silicon, is represented by a thick line 3. This therefore separates an N-conducting layer 4 produced by the phosphorus diffusion, from the still P-conducting layer 5 bounded by a metal layer 6.

Figures 2, 3:
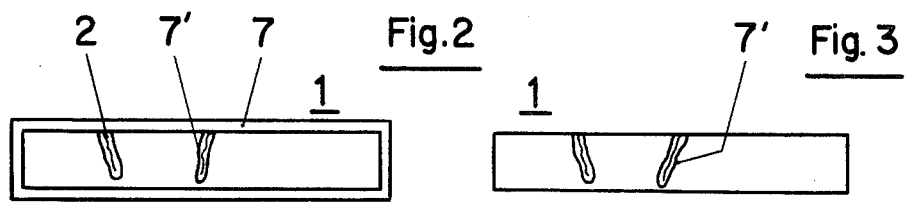
FIGS. 2 and 4 are views of a polycrystalline silicon wafer in the treatment stages according to the invention.

In the method of the invention, in an oxidation phase as described above, the silicon wafer 1, perhaps $10 \times 10$ cm with a thickness of 100 $\mu$m and more, e.g. 350 $\mu$m, and with a resistivity of 0.1 to 10 ohm cm, is coated all over with an oxide layer 7, the grain boundaries 2 thereby being enveloped in internal SiO$_2$ protective layers 7' (shown schematically in FIG. 2).

Figure 4:
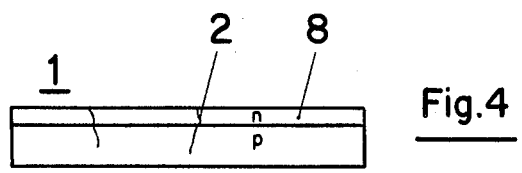

In FIG. 3 is shown the same silicon wafer 1 with the superficial oxide skin 7 etched away while the internal SiO$_2$ layers 7' remain intact. If now a phosphorus or lithium diffusion is carried out on the surface, as shown in FIG. 4 there is obtained a PN-junction 8 that no longer has the troublesome projections or diffusion spots exhibited in FIG. 1. Thereafter, the wafer is immersed in hydroflouric acid, as described above.

Instead of the immersion in hydrofluoric acid, a familiar etch-polishing process which preserves the internal SiO$_2$ layers 7' can be used.

Figures 5, 6:
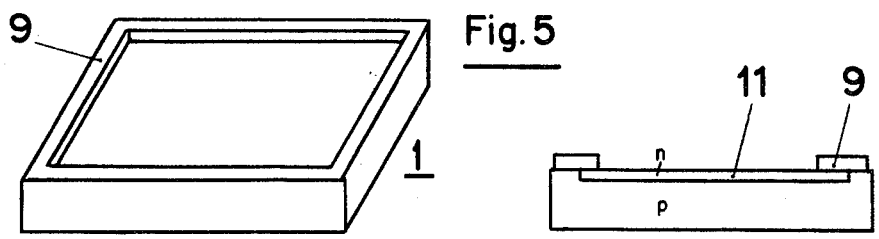
FIG. 5 is a perspective view of a finished semiconductor component with edge-covering.
FIG. 6 is a view of the semiconductor component of FIG. 5 in cross-section normal to its main surfaces; and, FIG. 7 is a representation of a PSN-diode.

Regions 9 of the oxide layer 7 can be left intact at the edges of a main surface (FIG. 5), covering the PN junction 11 emerging at this main surface (FIG. 6).

Figure 7:
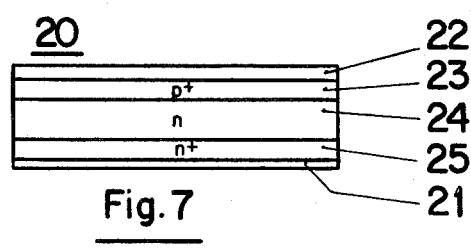

FIG. 7 shows a PSN diode 20 fabricated by the method of the invention, with two metal layers 21, 22, a P+ conducting layer 23, a weakly N-conducting layer 24 and an N+ conducting layer 25. The starting material is weakly N-conducting silicon, diffused on both sides after oxidation and removal of the SiO$_2$ layer.

Obviously, numerous modifications and variations of the present invention are possible in light of the above teachings. It is therefore to be understood that within the scope of the appended claims, the invention may be practiced otherwise than as specifically described herein.

What is claimed is new and desired to be secured by Letters Patent of the United States is:

1. In a method for producing semiconductor components, and in particular solar elements, wherein at least two layers of different conductivity types and a corresponding PN junction are formed in a P- or N-conducting semiconductor chip, the improvement comprising:
    subjecting said semiconductor chip to an oxidation at a temperature of 900° to 1150° C. prior to forming the PN junction such that the external surface and internal grain boundaries of said chip are covered with an oxide layer;
    removing partially the oxide layer from said external surface of said chip while the oxide layers at said grain boundaries are preserved intact; and,
    forming at least one PN junction in the semiconductor chip;
    wherein a portion of said oxide layer is retained at the edges of at least one external surface to cover at least one PN junction formed thereunder.

2. A method according to claim 1, wherein said step of forming at least one PN junction comprises:
    forming a P+, weak N and N+ junction layer sequence to serve as a PSN diode.

* * * * *